United States Patent
Cho et al.

(10) Patent No.: US 6,459,727 B1
(45) Date of Patent: Oct. 1, 2002

(54) VERY HIGH SPEED DIGITAL SUBSCRIBER LINE RECEIVER, AND PROGRAMMABLE GAIN AMPLIFIER AND NARROW-BAND NOISE REMOVER THEREOF

(75) Inventors: Myeon-kyun Cho, Sungnam; Eung-sun Kim, Seoul, both of (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/289,991

(22) Filed: Apr. 13, 1999

(30) Foreign Application Priority Data

May 11, 1998 (KR) .......................................... 98-16786

(51) Int. Cl.[7] .............................. H04B 1/38; H04L 5/16
(52) U.S. Cl. ...................... 375/222; 375/232; 375/345; 375/350
(58) Field of Search ............................... 375/232, 285, 375/345, 346, 350, 222

(56) References Cited

U.S. PATENT DOCUMENTS

| | | | |
|---|---|---|---|
| 5,020,078 A | * 5/1991 | Crespo ........................ | 375/233 |
| 5,142,695 A | 8/1992 | Roberts et al. | |
| 5,230,012 A | * 7/1993 | Schenk ....................... | 375/350 |
| 5,335,359 A | * 8/1994 | Tsujimoto et al. .......... | 375/345 |
| 5,563,916 A | 10/1996 | Scarpa | |
| 5,974,101 A | * 10/1999 | Nago .......................... | 375/350 |
| 6,181,731 B1 | * 1/2001 | Kochi et al. ................ | 375/144 |

FOREIGN PATENT DOCUMENTS

JP          3-91312          4/1991

* cited by examiner

*Primary Examiner*—Don N. Vo
(74) *Attorney, Agent, or Firm*—Burns, Doane, Swecker & Mathis, LLP (57) ABSTRACT

A very high digital subscriber line (VDSL) receiver, and a programmable gain amplifier (PGA) and a narrow-band noise remover thereof. The VDSL receiver includes: a first programmable gain amplifier (PGA) for controlling gain to output a signal having a predetermined amplitude and amplifying the input signal according to the controlled gain; a narrow-band noise remover for detecting the narrow-band noise from the output signal of the first PGA, modeling the narrow-band noise to remove the noise from the output signal of the first PGA if the narrow-band noise is detected, and outputting the inherent output signal of the first PGA if the narrow-band signal is not detected; a second PGA for amplifying the output signal from the narrow-band noise remover based on the gain controlled by the first PGA if narrow-band noise exists, and outputting the inherent output signal of the narrow-band noise remover without amplification if narrow-band noise is not detected; an equalizer for compensating for the deteriorated characteristics of the output signal from the second PGA; and a slicer for converting the output signal of the equalizer into a digital signal. Thus, a desired level of the input signal can be maintained against sudden inflow of an external interference signal, so that error generated by sudden change in power can be prevented. Accordingly, a VDSL system adopting the receiver can function normally regardless of inflow of a high-power signal.

13 Claims, 10 Drawing Sheets

VERY HIGH SPEED DIGITAL SUBSCRIBER LINE RECEIVER, AND PROGRAMMABLE GAIN AMPLIFIER AND NARROW-BAND NOISE REMOVER THEREOF

This application claims priority under 35 U.S.C. §§119 and/or 365 to 98-16786 filed in Korea on May 11, 1998; the entire content of which is hereby incorporated by reference.

BACKGROUND OF THE INVENTION

1. Field of the Invention

The present invention relates to a very high speed digital subscriber line (VDSL) receiver, and a programmable gain amplifier (PGA) and a narrow-band noise remover thereof, and more particularly, to a VDSL receiver for controlling gain during reception of a signal including narrow-band noises, and a PGA and a narrow-band noise remover thereof.

2. Description of the Related Art

As the need for information transmission increases, there has been much research conducted to find a method for transmitting data at high speed. In particular, research has concentrated on a method utilizing conventional telephone lines to transfer information at a high speed.

VDSL is a technology for transferring data at a high speed to subscribers over conventional telephone lines eliminating the need for selection of a specific pair of lines and which does not require particular conditions or a redesign of the conventional telephone lines. In the VDSL, data streams consist of high-speed data 20 such as compressed video data, going toward subscribers from an information source, and high-speed data such as a control signal, going toward the information source from the subscriber.

Figure 1:
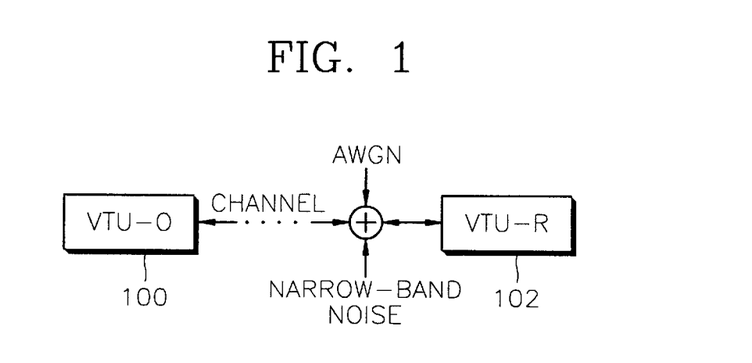
FIG. 1 is a block diagram of a very high speed digital subscriber line (VDSL) system.

A VDSL system, as shown in FIG. 1, comprises a VTU-O (VDSL Transmission Unit at the Optical Network Unit) 100 for transmitting data to subscribers and receiving data from the subscribers, and a VTU-R (VDSL Transmission Unit at the Remote Location) 102 connected through a channel to the VTU-O, for transmitting data to the information source and receiving data therefrom. During data transmission through the channel between the VTU-O 100 and the VTU-R 102, AWGN (Additive White Gaussian Noise) and narrow-band noise intrudes.

The AWGN refers to the noises distributed over a wide frequency band with a relatively small amplitude, and narrow-band noise refers to the noises generated at a narrow frequency band with a high amplitude and causing serious errors to a s receiving site. The narrow-band noise can be in the form of an RFI (Radio Frequency Interference) or an impulsive noise. RFI is signal interference from ham radio communications. According to the characteristics of the RFI, generation of such signals is not continuous. That is, the signals are randomly generated or disappear over several milliseconds to several seconds. Also, the generated signal occupies an arbitrary frequency band, thus it is a major interference factor compared to a general broadcast wave. On the other hand, in the case that impulsive noise is generated when a fluorescent lamp is turned on, its interference duration lasts several microseconds, which is too short and thus negligible.

Figure 2:
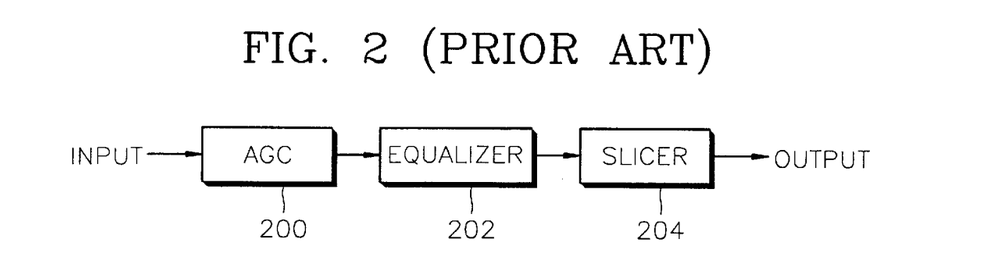
FIG. 2 is a block diagram of a conventional VDSL receiver.

FIG. 2 is a block diagram of a conventional VDSL. The VDSL comprises an automatic gain controller (AGC) 200, an equalizer 202 and a slicer 204.

The conventional VDSL of FIG. 2 operates as follows. The AGC 200 controls the power of an input signal to a desired level, and the equalizer 202 compensates for deteriorated characteristics of the signal output from the AGC 200. The slicer 204 converts the output of the equalizer 202 into a digital value according to a threshold value.

Figure 3:
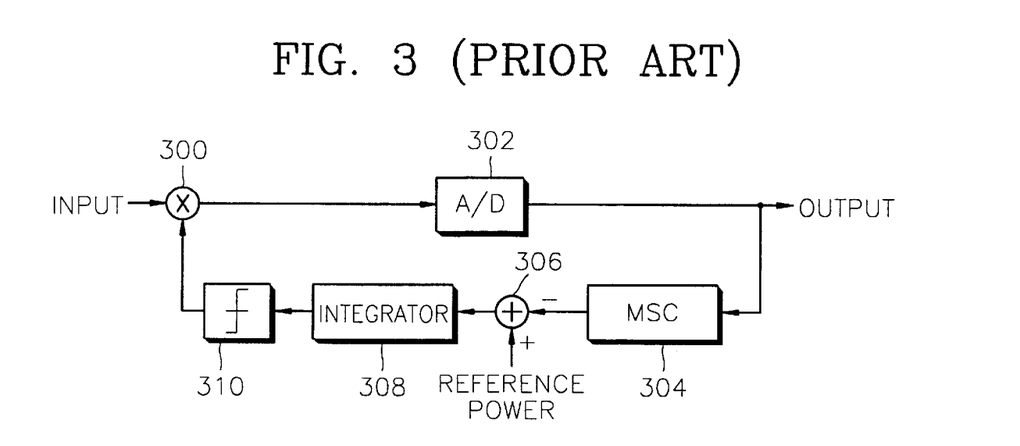
FIG. 3 is a detailed block diagram of the automatic gain controller (AGC) of FIG. 2.

FIG. 3 is a detailed block diagram of the AGC 200 of FIG. 2. The AGC 200 comprises a multiplier 300, an analog-to-digital converter (ADC) 302, a mean square calculator (MSC) 304, an adder 306, an integrator 308 and a gain regulator 310.

The AGC 200 operates as follows. First, the multiplier 300 multiplies the input signal by a feedback gain-controlled value. The ADC 302 converts the output of the multiplier 300 into a digital signal and outputs the digital signal. The MSC 304 calculates the mean power to the output signal of the ADC 302. The adder 306 calculates the difference between the mean power and a reference power level, and the integrator 308 integrates the output of the adder 306, which is for making the signal insensitive to surrounding noises. The gain regulator 310 compares the output of the integrator 308 with a threshold value to output a gain control value according to the comparison back to the multiplier 300.

The main function of the above-described AGC is to provide a desired power level to the input signal. Thus, the requirements of a device such as a synchronizer which requires an input signal to be a predetermined step size or belong to a predetermined dynamic range of a receiving site may be not satisfied. Also, the conventional AGC controls the gains to a predetermined amplitude regardless of surrounding interference signals, so that it cannot cope with sudden changes in power due to major interference factors such as RFI. Accordingly, it is not possible to process the error generated by a sudden surge or drain of power. For example, when only a signal is input during initialization of a system, the AGC controls the gain only based on the input signal. Here, when an RFI signal having a power equivalent to the original signal is input suddenly, the power of all signals is doubled. Accordingly, when the signals pass through the ADC, the original signal is clipped, thereby causing quantization error.

Also, when strong narrow-band noise such as RFI intrudes into transmission lines, the performance of the conventional receiver deteriorates. As a result, desired performance of the entire system cannot be realized, When the amplitude of the narrow-band noise is very large, the operation at the receiving site becomes unstable, and the tap coefficient of an equalizer of the receiving site diverges such that transmitted data cannot be detected. Also, because no one can predict when, at what amplitude and into which frequency narrow band noise will intrude, it is not possible to adaptively remove the narrow-band noise.

SUMMARY OF THE INVENTION

To solve the above problems, it is an object of the present invention to provide a programmable gain amplifier (PGA) for maintaining the amplitude of an attenuated or distorted signal input to a receiving site of a very high speed digital subscriber line (VDSL) system at a desired level, narrow-band noise remover for removing narrow-band noises mixed in the input signal, and a VDSL receiver having the same.

According to an aspect of the present invention, there is provided a very high speed digital subscriber line (VDSL) receiver for processing an input signal to which a narrow-band noise is inflowed, for high-speed transmission, the receiver comprising: a first programmable gain amplifier (PGA) for controlling gain to output a signal having a predetermined amplitude and amplifying the input signal according to the controlled gain; a narrow-band noise remover for detecting the narrow-band noise from the output signal of the first PGA, modeling the narrow-band noise to remove the noise from the output signal of the first PGA if the narrow-band noise is detected, and outputting the inherent output signal of the first PGA if the narrow-band signal is not detected; a second PGA for amplifying the output signal from the narrow-band noise remover based on the gain controlled by the first PGA if narrow-band noise exists, and outputting the inherent output signal of the narrow-band noise remover without amplification if narrow-band noise is not detected; an equalizer for compensating for the deteriorated characteristics of the output signal from the second PGA; and a slicer for converting the output signal of the equalizer into a digital signal.

According to another aspect of the present invention, there is provided a programmable gain amplifier (PGA) for controlling a gain to amplify an input signal, comprising: a multiplier for multiplying the input signal by a feedback signal; an analog-to-digital converter (ADC) for converting the output of the multiplier into a digital signal, and outputting the digital signal; a peak detector and averager for detecting peak values among a predetermined number of sampled signals output from the analog-to-digital converter, and calculating the average of the peak values; a multi-threshold detector for outputting a signal indicating a change in gain to its first output end, and a signal controlling a step size of the gain to its second output end, according to the output of the peak detector and averager; and a gain regulator for determining the step size according to the output signal of the second output end of the multi-threshold detector, and controlling the gain according to the determined step size and the output signal of the first output end, to output the controlled gain to the multiplier.

According to still another aspect of the present invention, there is provided a narrow-band noise remover for removing a narrow-band noise from an input signal to which a narrow-band noise is inflowed, comprising: a first delay for delaying the input signal by a predetermined period; an adaptive filter for modeling the delayed signal; a switch controller for determining that the narrow-band noise is inflowed if the output value of the adaptive filter is higher than a predetermined level, and turning on a switch to output the output value of the adaptive filter; and an adder for subtracting the output value of the adaptive filter, input when the switch is turned on, from the input value.

BRIEF DESCRIPTION OF THE DRAWINGS

The above object and advantages of the present invention will become more apparent by describing in detail a preferred embodiment thereof with reference to the attached drawings in which.

DESCRIPTION OF THE PREFERRED EMBODIMENT

Figure 4:
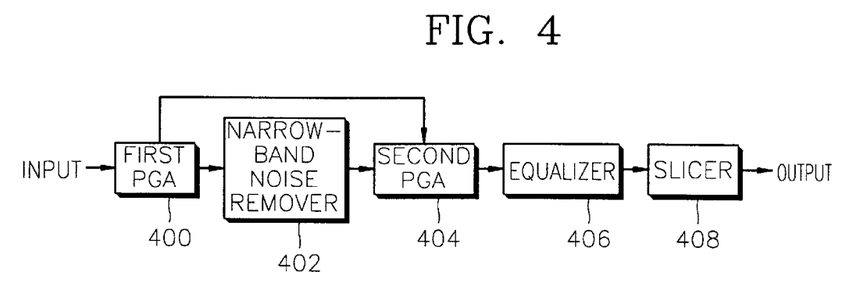
FIG. 4 is a block diagram of a VDSL receiver according to the present invention.

Referring to FIG. 4, a very high speed digital subscriber line (VDSL) receiver according to the present invention includes a first programmable gain amplifier (PGA) 400, a narrow-band noise remover 402, a second PGA 404, an equalizer 406 and a slicer 408.

The VDSL receiver of FIG. 4 operates as follows. The first PGA 400 maintains the amplitude of an input signal at a desired level. The narrow-band noise remover 402 determines whether or not a narrow-band noise exists in the input signal from the output signal of the first PGA 400. If narrow-band noise exists, the narrow-band noise remover 402 removes the narrow-band noises. Otherwise, the narrow-band noise remover 402 passes the output signal of the first PGA 400 as it is. The second PGA 404 controls the gain of the output signal 404-3 of the narrow-band noise remover 402 based on a signal 404-2 indicating whether or not the narrow-band noise has been removed. That is, if the output signal 404-3 is a low power signal which is the resulting signal after the narrow-band noise is removed in the narrow-band noise remover 402, the gain of the output signal 404-3 is amplified to an appropriate level in consideration of the gain of the signal 404-1 output from the first PGA 400. Meanwhile, in the case when the narrow-band noise remover 402 outputs the signal without removal of the narrow-band noise, the second PGA 404 passes the signal without amplification such that the amplitude of the signal is maintained at a predetermined level. The equalizer 406 compensates for the deteriorated characteristics of the output signal of the second PGA 404, and the slicer 408 converts the output of the equalizer 406 to a digital value according to a threshold value.

Figure 5:
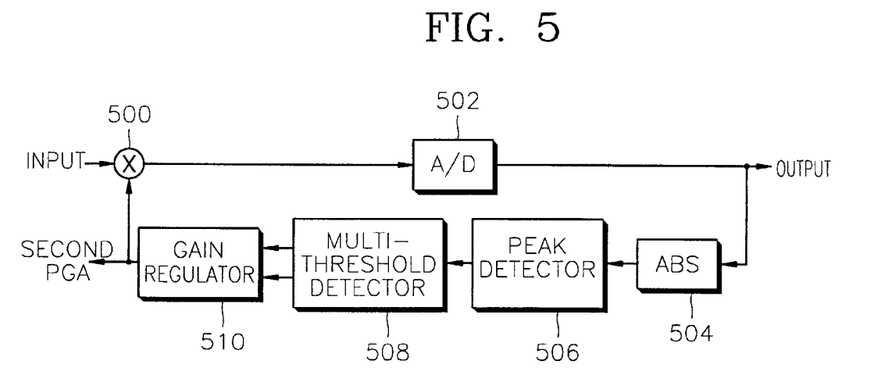
FIG. 5 is a block diagram of the first PGA of FIG.4.

As shown in FIG. 5, the first PGA 400 includes a multiplier 500, an ADC 502, an absolute value calculator (ABS) 504, a peak detector and averager 506, a multi-threshold detector 508 and a gain regulator 510.

The multiplier 500 multiplies the input signal by a feedback signal. The ADC 502 converts the output signal of the multiplier 500 into a digital signal and outputs the digital signal. The absolute value calculator 504 calculates the absolute value of the digital signal. The reason why the absolute value is calculated is that the output signal of the ADC 502 must exist within a predetermined level of amplitude instead of being controlled to a predetermined power level. For example, if a squared value is utilized to maintain a predetermined power level-a number greater than 1 becomes larger while a number less than 1 becomes smaller. Thus, it is favorable to utilize the absolute value.

Figure 6:
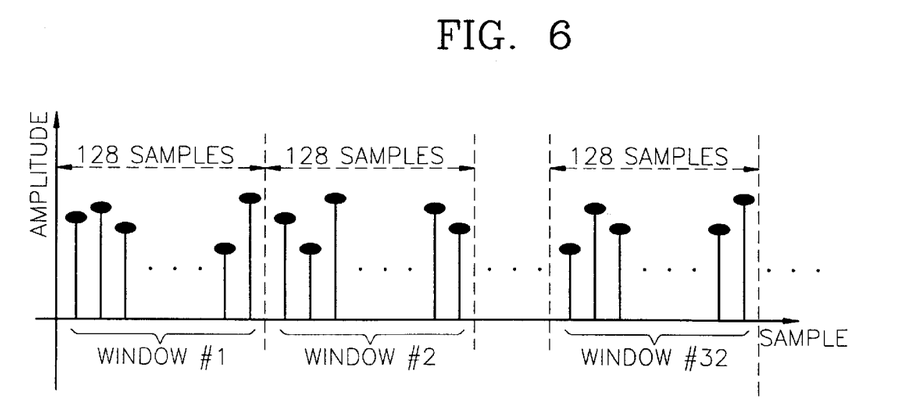
FIG. 6 illustrates the operation of the peak detector and averager of FIG. 5.

The peak detector and averager 506 sets windows to the output of the absolute value calculator 504, detects peak amplitudes of the samples with each window, and calculates the average of the peak values on each window. Detecting the peak values is for securing a stable output of the first PGA, which operates within a predetermined amplitude level. The size of the windows may vary. The larger the window is, the more stable the operation of the first PGA is and the longer the period for convergence is. Also, calculating the average of the peak values of each window is for making the output of the first PGA less sensitive to noise. The number of windows for calculating the average of the peak values is determined in consideration of the relationship between each peak value and the average power. FIG. 6 illustrates the operation of the peak detector and average 506 in case there are 32 windows each of which consists of 128 samples.

Figure 7:
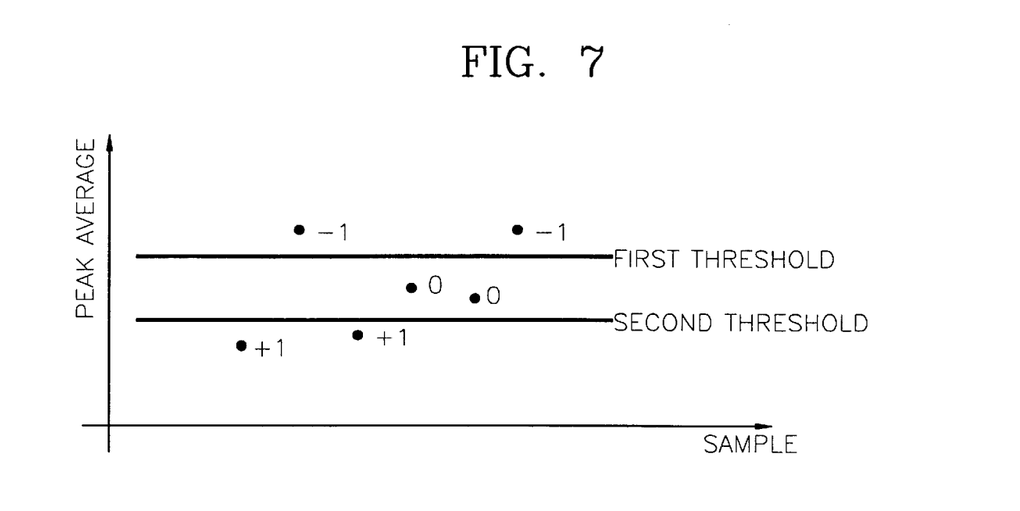
FIG. 7 shows the output values of a first output end of the multi-threshold detector according to the output value of the peak detector and averager of FIG. 5.

The multi-threshold detector 508 detects the level of the output of the peak detector and averager 506 to control the gain to be fed back into the multiplier 500, and outputs predetermined values respectively to first and second output ends according to the detected level. For example, if the output of the peak detector and averager 506 is equal to or greater than a first threshold value, the multi-threshold detector 508 outputs −1 to the first output end, and if the output of the peak detector and averager 506 is less than a second threshold value, the multi-threshold detector 508 outputs +1 to the first output end. Also, if the output of the peak detector and averager 506 is a value between the first and second threshold values, the multi-threshold detector 508 outputs 0 to the first output end. FIG. 7 illustrates the relationship between the output values (·) of the peak detector and averager 506 and the output value to the first output end.

Figure 8:
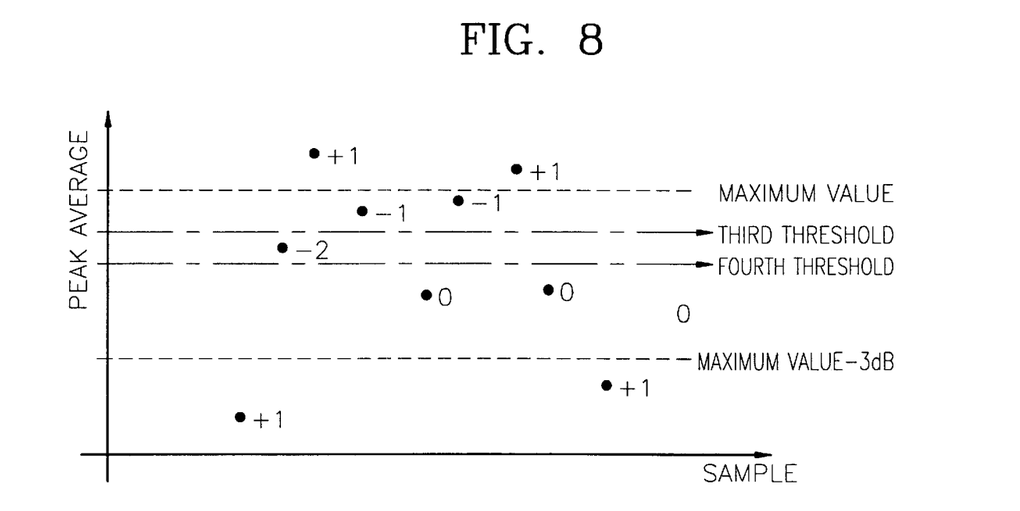
FIG. 8 shows the output values of a second output end of the multi-threshold detector according to the output value of the peak detector and averager of FIG. 5

A control signal for controlling the step size of the gain is output to the second output end. For example, when the value output to the first output end is changed from a positive (+) value to a negative (−) value, the multi-threshold detector 508 outputs −1 to the second output end. When the output of the peak detector and averager 506 is equal to the maximum value of analog-to-digital-converted bits by the surge of narrow-band noises, or the output of the peak detector and averager 506 suddenly drops to a level lower than 3 dB of the maximum value of the analog-to-digital converted bits by the sudden drain of the narrow-band noises, the multi-threshold detector 508 outputs +1 to the second output end. If the output of the peak detector and averager 506 is equal to or less than a third threshold value, and is equal to or greater than a fourth threshold value, the multi-threshold detector 508 outputs −2 to the second output end. In other conditions, the multi-threshold detector 508 outputs 0 to the second output end. FIG. 8 illustrates the relationship between the output values (·) of the peak detector and averager 506 and the output value to the second output end.

The gain regulator 510 regulates the gains using the values output from the first and second output ends of the multi-threshold detector 508, and outputs the regulated gains to both the multiplier 500 and the second PGA 404. The gains are regulated according to the following Equation (1).

$$\text{gain}(n+1) = \text{gain}(n) + \text{output value of the first output end of the multi-threshold detector} * \text{gain step size} \quad (1)$$

In Equation (1), n refers to the $n^{th}$ sampling.

The gain step size is determined by the control signal input from the second output end of the multi-threshold detector 508. For example, assuming that the gain step size is set to 1.6, 0.8 or 0.4, the gain step size is lowered by one step from the current step size when the control signal is −1. When the control signal is +1, the gain step size is maximized to 1.6 for rapid adaptation. Also, when the control signal is −2, the gain step size is minimized to 0.4. The gain control based on the gain step size is for detecting change in power of the input signal, caused by a sudden interference of an external signal, thereby preventing errors which may be generated during the analog-to-digital conversion. For example, when the maximum value of the analog-to-digital converted bits is output from the multiple-threshold detector 508, which means that a clipping error is generated by the inflow of the narrow-band noises, it is preferable to control the gain to a lower value. Also, when the narrow-band noise which has increased reception power suddenly disappears, so that the level of the reception power is rapidly lowered, it is preferable to control the gain to a high value such that the output of the receiver is maintained at a predetermined level. When the output value of the multi-threshold detector 508 is a value between the third and fourth threshold values, which indicates a stable state, the gain step size is minimized to accurately follow the signal.

Figure 9:
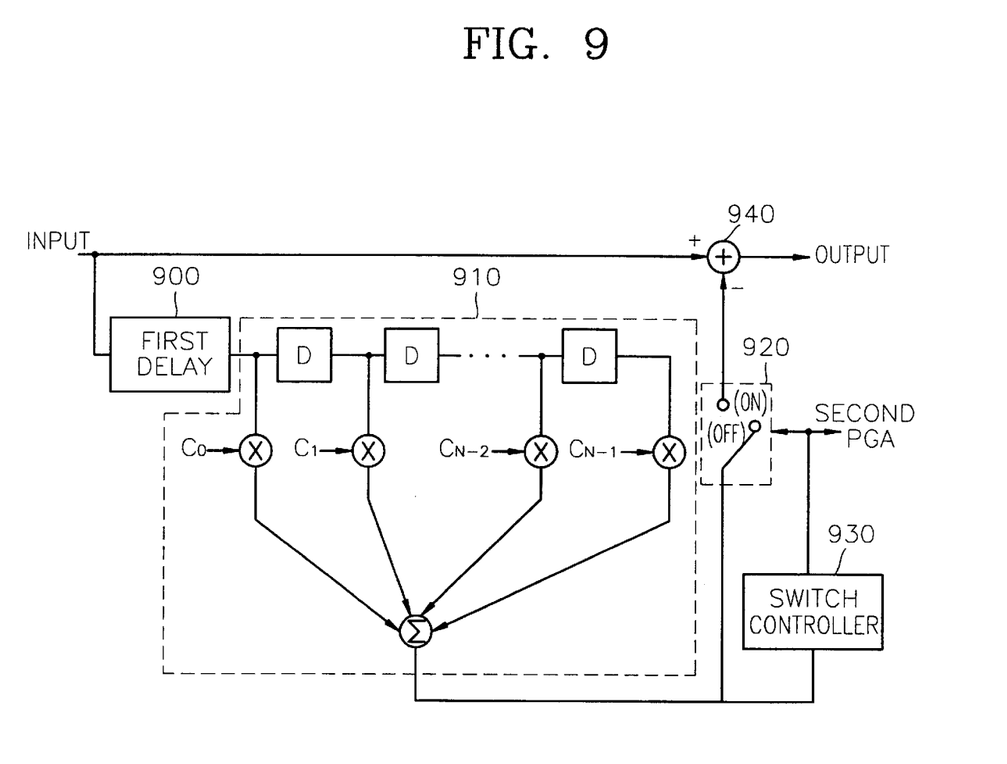
FIG. 9 is a detailed block diagram of the narrow-band noise remover of FIG. 4.

As shown in FIG. 9, the narrow-band noise remover 402 includes a first delay 900, an adaptive filter 910, a switch 920, a switch controller 930 and an adder 940.

In the narrow-band noise remover 402, the first delay 900 delays the transmitted signal by a predetermined period τ. Here, the delay period τ refers to the period during which auto-correlation of a VDSL transmission signal is very small while the auto-correlation of a narrow-band noise is very large, which is determined as follows. The VDSL transmission signal occupies a wide band width compared to the narrow-band noise, so that the transmission signal has a very low correlation compared to the narrow-band noise. That is, the input signal is the sum of a signal having a very high correlation and a signal having a very low correlation. Here, the narrow-band noise is removed by extracting the high-correlation signal from the input signal. An auto-correlation function $R_{xx}(\tau)$ with respect to a signal x(t) is as indicated in the following Equation (2).

$$R_{xx}(\tau) = E[x(t)x(t+\tau)] \quad (2)$$

The delay period τ is determined by the Equation (2). The signal delayed by τ in the first delay 900 is modeled through the adaptive filter 910 which is a kind of finite impulse response filter.

In the adaptive filter 910, the signal is delayed by a plurality of delays D each by a predetermined period T, each delayed signal is multiplied by a tap coefficient $C_n$ (n=0, ..., N−1), and the sum of the products is calculated. The weight $C_n$ is updated using the Stochastic Gradient Algorithm represented by the following Equation (3), such that the difference between the input signal and the final output signal of the adaptive filter 910 decreases.

$$C_n(k+1) = C_n(k) - \mu e_k r(kT - nT) \quad (3)$$

In the Equation (3), the terms are defined as follows:

$C_n(k)$: tap coefficient of the $n^{th}$ tap at the time kT;

μ: step.size for updating the tap coefficient;

r(t): output signal of the first delay 900;

$e_k$: z(k7)−r(kT); and z(kT): output of the adaptive filter 910 at the time kT.

The switch controller 930 determines that the narrow-band signal is mixed if the amplitude of the output signal from the adaptive filter 910 is greater than a predetermined value, turns on the switch 920, and then outputs a switch-on signal indicating the ON-state of the switch 920 to the second PGA 404 (see FIG. 4). On the contrary, if the amplitude of the output signal from the adaptive filter 910 is smaller than the predetermined value, the switch controller 930 determines that the narrow-band signal is not input, and then turns off the switch 920.

When the switch 920 is turned on, the adder 940 subtracts the output value of the adaptive filter 910 from the signal input from the first PGA 400 (see FIG. 4), to output the signal from which the narrow-band noise has been removed to the second PGA 404.

The second PGA 404 stores the input gains, which are determined by the gain regulator 510 of the first PGA 400, for a predetermined period in sequence, and compares the gain stored a predetermined period earlier when the switch 920 is turned on according to the switch-on signal input from the switch controller 930, with the gain after a predetermined period passes from the turning on of the switch 910. The second PGA 404 controls its own gain according to the gain difference before and after the switch 920 is turned on, to maintain the amplitude of the power-lowered signal whose power is lowered due to the narrow-band noise at an appropriate level. In order to prevent the tap coefficients of the equalizer 406 from diverging during determination of the gains, it is preferable that the tap coefficients are not updated during a predetermined period after the switch 920 is turned on.

Also, when the switch 920 is turned off, the second PGA 404 determines that the narrow-band noise is not applied or disappears, and controls its own gain to 0.

FIGS. 10A through 13F illustrate the difference of simulation results between the prior art and the present invention. Here, the desired output level was set to 2. Also, 16 CAP (Carrierless Amplitude and Phase Modulation) signals having a sampling frequency of 51.84 MHz, as a transmission signal, are transmitted through 26 AWG 1 Kft channel, and 11 FEXT (Far End Crosstalk) was added to the transmission signal, such that the gain required for the desired output level would be 20 dB. Then, an RFI signal having a central frequency of 10 MHz and the same power as that of the input signal was generated, input to the each PGA for a predetermined period, and then removed. Then, the performances of the PGA and the VDSL receiver were measured. Also, variable gain step sizes of the first PGA were 1.6, 0.8 and 0.4 dB.

Figure 10A:
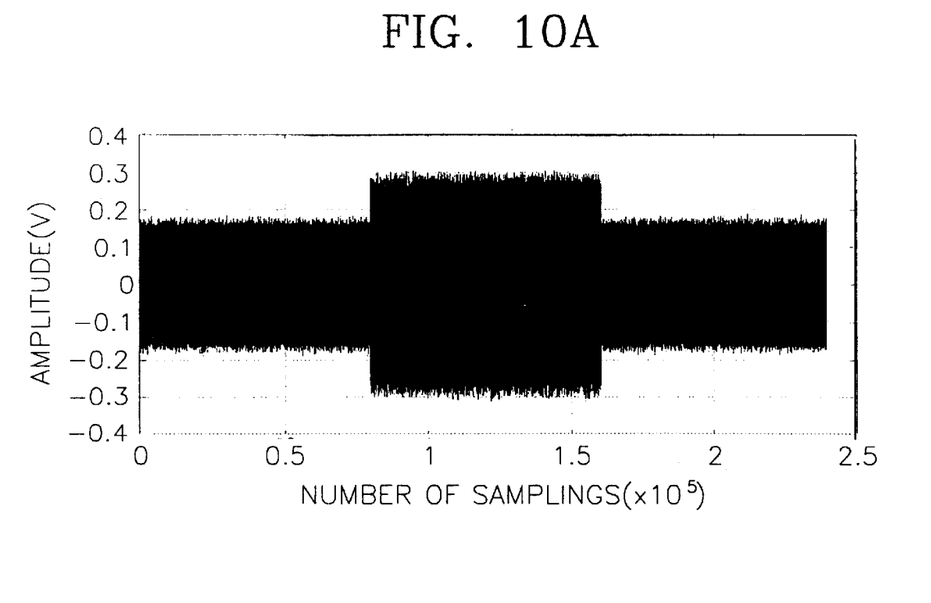
FIGS. 10A through 10C show an input signal to a conventional AGC and the first PGA according to the present invention and output signals therefrom.
Figure 10B:
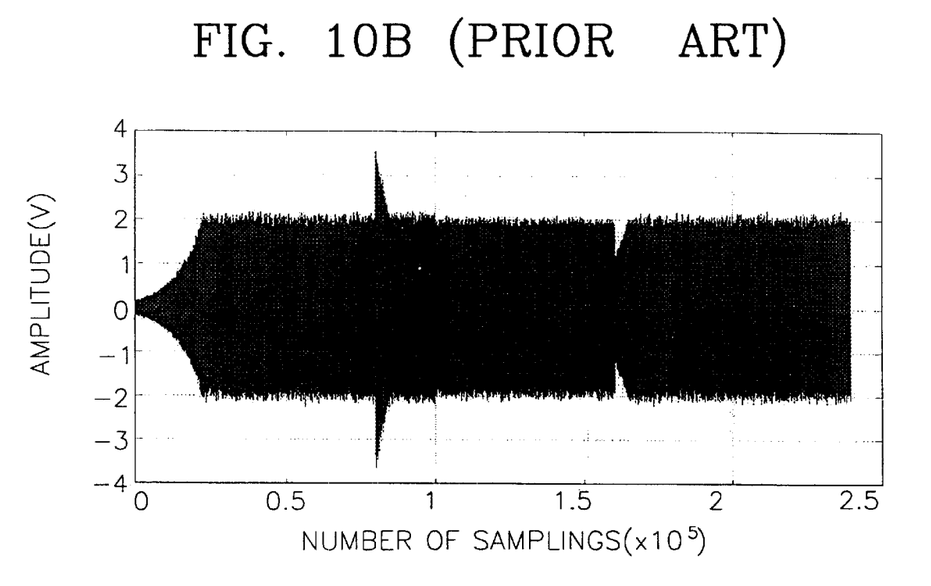
Figure 10C:
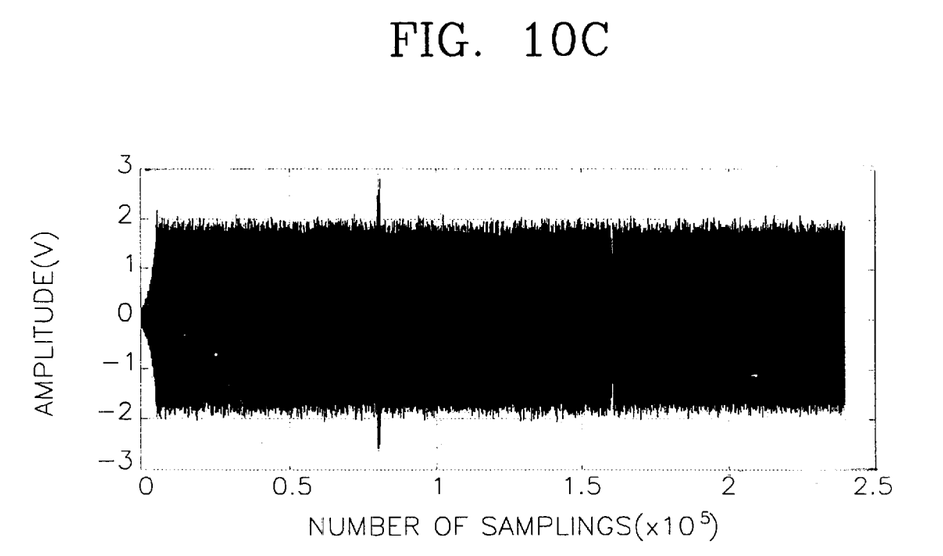

FIGS. 10A through 10C comparatively show the output signals of the conventional AGC and the first PGA according to the present invention. In detail, FIG. 10A shows a signal to be input to the conventional AGC and the first PGA according to the present invention, to which the narrow-band noise is applied. For the result of FIG. 10A, the input signal was generated using 16 CAP signals and a radio frequency interference (RFI) signal having a power level higher than the input signal by 3 dB was then applied to the input signal. Here, the narrow-band noise was introduced at the 80,000$^{th}$ sampling and then removed at the 160,000$^{th}$ sampling. FIG. 10B shows the output signal from the conventional AGC and FIG. 10C shows the output signal from the first PGA according to the present invention. As shown in FIG. 10B, when the gain is updated by applying the narrow-band noise, the amplitude of the output signal from the conventional AGC far exceeds the intended amplitude ±2, so that the output signal is relatively unstable. On the contrary, the output signal of the first PGA according to the present invention is stable within the intended amplitude range of ±2 when the first PGA reaches a steady state as shown in FIG. 10C. Thus, the first PGA according to the present invention can reduce erroneous intervals caused by the narrow-band noise such as an RFI, compared to the conventional AGC.

In case the first PGA of the present invention is applied to an actual VDSL system, the gain updating by the gain regulator of the first PGA does not continue; rather gain updating stops after the output value converges on a steady state, and the gain regulator operates only when there is a sudden inflow of the narrow-band signal from the outside. As a result, the load on the entire system can considerably be reduced.

Figure 11A:
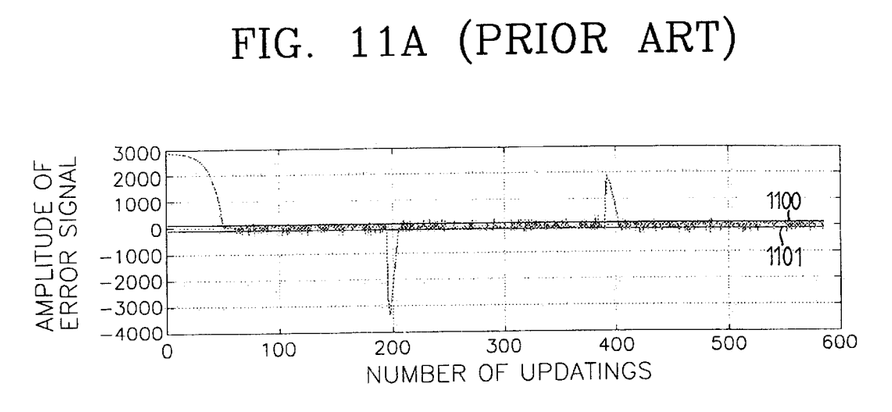
FIGS. 11A through 11D illustrate the change in total gain by the conventional AGC and the first PGA according to the present invention.
Figure 11B:
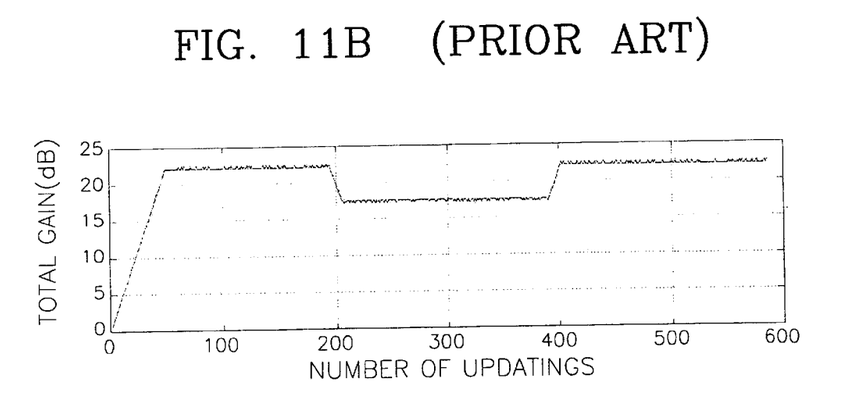

FIGS. 11A and 11B show amplitude of the error signal and total gain by the conventional AGC according to the number of updatings when the signal of FIG. 10A is input. Every updating is performed on 32×128 samples, and reference numerals 1100 and 1101 represent first and second threshold values, respectively. As shown in FIGS. 11A and 11B, the conventional AGC cannot respond rapidly to sudden surge of the narrow-band signal after it output signal reaches the steady state, so that it is difficult to expect rapid change of gain. As a result, a saturation error is generated through the analog-to-digital conversion during the inflow of the noise, thereby deteriorating the overall performance of the system. Also, perturbations of gain continue even after convergence on the steady state, thereby lowering stability.

Figure 11C:
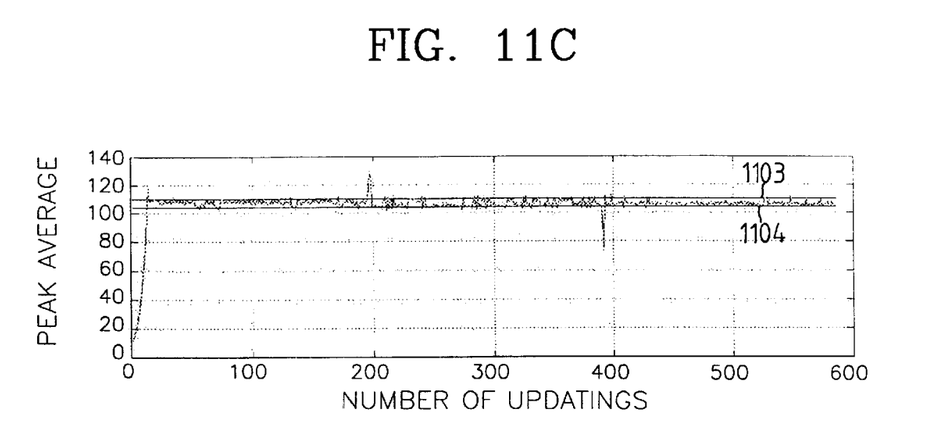
Figure 11D:
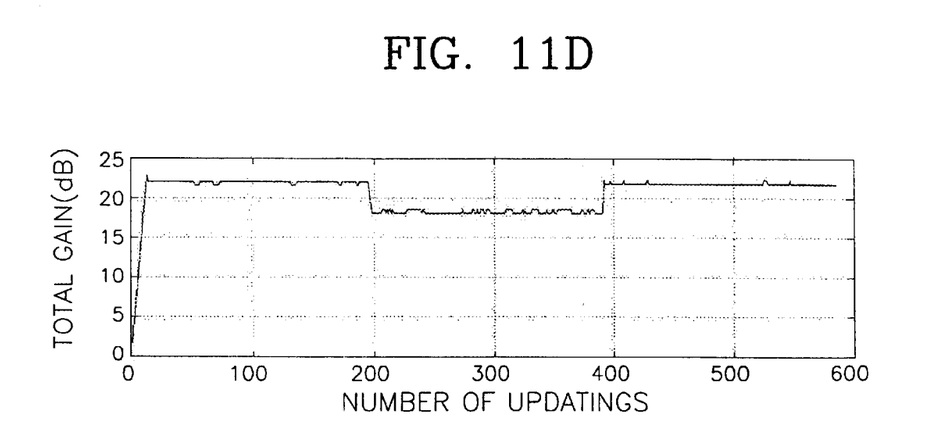

FIGS. 11C and 11D show the peak average and the total gain by the first PGA according to the present invention according to the number of updatings when the signal of FIG. 10A is input. Here, reference numerals 1103 and 1104 represent third and fourth threshold values. First, it can be understood from FIG. 11C that it takes less time to reach the steady state compared to the conventional case shown in FIG. 10A. Also, change in gain is rapid when the narrow-band signal is applied after the output signal reaches the steady state. As a result, most output values converge on the steady condition, and the first PGA responds rapidly to sudden disappearance of the narrow-band noise, thereby minimizing distortion of the input signal.

Figure 12:
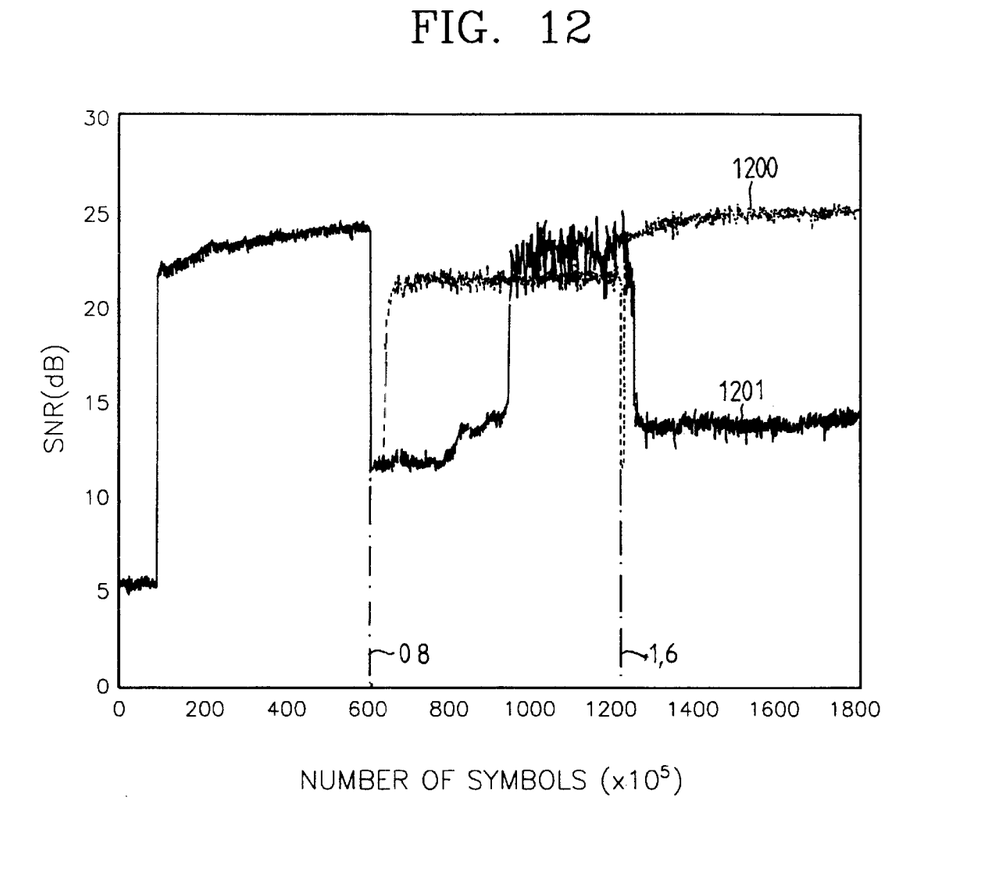
FIG. 12 is a graph showing signal-to-noise ratios (SNRs) of equalizers in a conventional receiver and a receiver according to the present invention.

FIG. 12 is a graph showing signal-to-noise ratios (SNRs) of equalizers in the conventional VDSL receiver and the VDSL receiver according to the present invention. Here, reference numeral 1200 represents the SNR of the VDSL receiver according to the present invention, and reference numeral 1201 represents the SNR of the conventional VDSL receiver. As shown in FIG. 12, the VDSL receiver according to the present invention shows a stable SNR when the narrow-band noise is present. Also, the equalizer according to the present invention rapidly converges after the noise disappears.

Figure 13A:
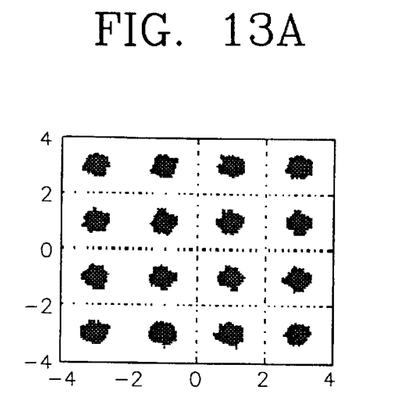
FIGS. 13A through 13F show constellations of the equalizers in the conventional receiver and in the receiver according to the present invention.
Figure 13B:
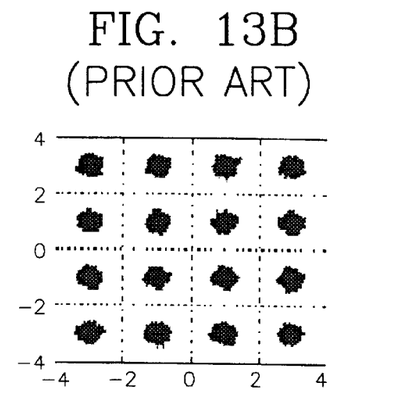
Figure 13C:
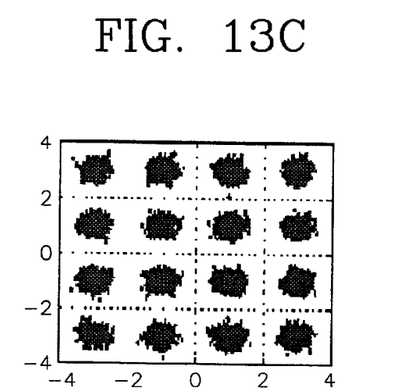
Figure 13D:
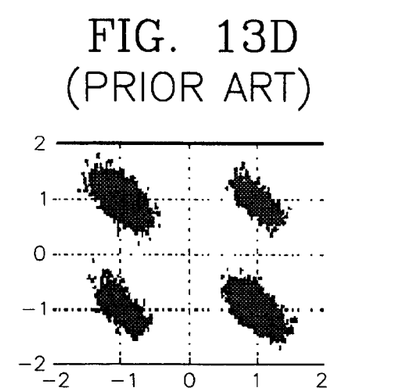
Figure 13E:
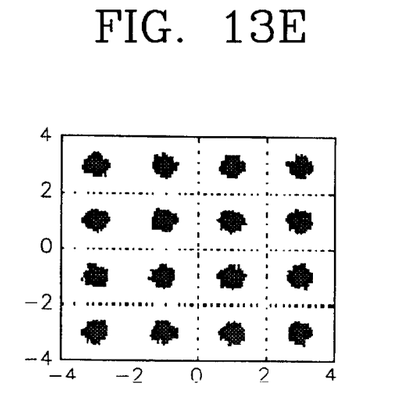
Figure 13F:
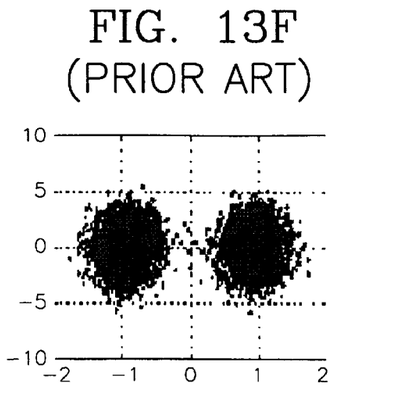

FIGS. 13A through 13F show constellations of the equalizers in the conventional VDSL receiver and the VDSL receiver according to the present invention. In detail, FIGS. 13A and 13B show constellations of the equalizers of the receiver according to the present invention and the conventional receiver, respectively, when the narrow-band noise is not present, i.e., up to the 80,000$^{th}$ sampling. FIGS. 13C and 13D show constellations of the equalizers of the receiver according to the present invention and the conventional receiver, respectively, when the narrow-band noise is present, i.e. during 80,000 samplings through the 160,000$^{th}$ sampling. FIGS. 13E and 13F show constellations of the equalizers of the receiver according to the present invention and the conventional receiver, respectively, after the narrow-band noise disappears. As can be understood from FIGS. 13A through 13F, in the case of using the conventional receiver, its operation is very unstable when the narrow-band noise is present and disappears, so that the conventional equalizer cannot operate normally. Meanwhile, the operation of the receiver according to the present invention is stable.

As described above, in the VDSL receiver according to the present invention, first, a desired level of the signal can be maintained even when an external interference signal suddenly appears, so that error generated by a sudden change in power, and malfunction of the system by the sudden surge of a high-power signal can be prevented. Also, the VDSL receiver according to the present invention can actively cope with narrow-band noise as described above, and an impulse noise can be negligible in this receiver. Thus, the overall performance of the VDSL system can show improved resistance to external interference.

Second, the output of the amplifier can be maintained within a predetermined range against a variable input signal, and the average of peak values of a predetermined interval is used as a control signal, so that the gain can faithfully be controlled with respect to the transmitted signal.

Third, the step size is controlled for gain control, so that the input signal can reach the steady state within a short time, and accurately follow the input signal after reaching the steady state. Thus, the VDSL receiver can rapidly cope with the sudden change in power of the input signal.

Fourth, the narrow-band noise inflowed to the original transmission signal at a specific band is removed, thereby preventing interference from the narrow-band noise.

Fifth, problems relating to convergence by the equalizer, such as delay in the convergence, which occurs when a high-power narrow-band noise is applied or disappear, can be prevented.

What is claimed is:

1. A very high speed digital subscriber line (VDSL) receiver for processing an input signal to which a narrow-band noise is inflowed, for high-speed transmission, the receiver comprising:
    a first programmable gain amplifier (PGA) for controlling gain to output a signal having a predetermined amplitude and amplifying the input signal according to the controlled gain;
    a narrow-band noise remover for detecting the narrow-band noise from the output signal of the first PGA, modeling the narrow-band noise to remove the noise from the output signal of the first PGA if the narrow-band noise is detected, and outputting the inherent output signal of the first PGA if the narrow-band signal is not detected;
    a second PGA for amplifying the output signal from the narrow-band noise remover based on the gain controlled by the first PGA if narrow-band noise exists, and outputting the inherent output signal of the narrow-band noise remover without amplification if narrow-band noise is not detected;
    an equalizer for compensating for the deteriorated characteristics of the output signal from the second PGA; and
    a slicer for converting the output signal of the equalizer into a digital signal.

2. The very high speed digital subscriber line (VDSL) receiver of claim 1, wherein the first PGA comprises:
    a multiplier for multiplying the input signal by a feedback signal;
    an analog-to-digital converter (ADC) for converting the output of the multiplier into a digital signal, and outputting the digital signal;
    a peak detector and averager for detecting peak values among a predetermined number of sampled signals output from the analog-to-digital converter, and calculating the average of the peak values;
    a multi-threshold detector for outputting a signal indicating a change in gain to its first output end, and a signal controlling a step size of the gain to its second output end, according to the output of the peak detector and averager; and
    a gain regulator for determining the step size according to the output signal of the second output end of the multi-threshold detector, and controlling the gain according to the determined step size and the output signal of the first output end, to output the controlled gain to the multiplier.

3. The very high speed digital subscriber line (VDSL) receiver of claim 1, wherein the narrow-band noise remover comprises:
    a first delay for delaying the output signal of the first PGA by a predetermined period;
    an adaptive filter for modeling the delayed signal;
    a switch controller for determining that the narrow-band noise is inflowed if the output value of the adaptive filter is higher than a predetermined level, and turning on a switch to output the output value of the adaptive filter; and
    an adder for subtracting the output value of the adaptive filter, input when the switch is turned on, from the input value.

4. The very high speed digital subscriber line (VDSL) receiver of claim 3, wherein the second PGA stores the gain controlled by the first PGA for a predetermined period, and calculates the difference of the gains stored before and after the switch is turned on, to determine its own gain according to the gain difference.

5. A programmable gain amplifier (PGA) for controlling a gain to amplify an input signal, comprising:
    a multiplier for multiplying the input signal by a feedback signal;
    an analog-to-digital converter (ADC) for converting the output of the multiplier into a digital signal, and outputting the digital signal;
    a peak detector and averager for detecting peak values among a predetermined number of sampled signals output from the analog-to-digital converter, and calculating the average of the peak values;
    a multi-threshold detector for outputting a signal indicating a change in gain to its first output end, and a signal controlling a step size of the gain to its second output end, according to the output of the peak detector and averager; and
    a gain regulator for determining the step size according to the output signal of the second output end of the multi-threshold detector, and controlling the gain according to the determined step size and the output signal of the first output end, to output the controlled gain to the multiplier.

6. The programmable gain amplifier (PGA) of claim 5, wherein the peak detector and averager detects the peak values on the absolute values of the outputs from the analog-to-digital converter.

7. The programmable gain amplifier (PGA) of claim 5, wherein the gain regulator regulates the gain using the following equation:

gain(*n*+1)=gain(*n*)+*a*\**b* wherein n represents a signal sampled through the n$^{th}$ sampling, a represents the output value of the first output end of the multi-threshold detector, and b represents the step size.

8. A narrow-band noise remover for removing narrow-band noise from an input signal to which narrow-band noise is inflowed, comprising:

a first delay for delaying the input signal by a predetermined period;

an adaptive filter for modeling the delayed signal;

a switch controller for determining that narrow-band noise is inflowed if an output value of the adaptive filter is higher than a predetermined level, and turning on a switch to output the output value of the adaptive filter when it is determined that narrow-band noise is inflowed; and an adder for subtracting the output value of the adaptive filter, input when the switch is turned on, from the input value.

9. The narrow-band noise remover of claim 8, wherein the first delay determines a delay time for which the auto-correlation of the narrow-band noise is high and the auto-correlation of the signals other than the noise is low, using the auto-correlation of the input signal, and delays the input signal by the detected delay time.

10. The narrow-band noise remover of claim 8, wherein the adaptive filter comprises:

a plurality of delays for delaying the output signal of the first delay by a predetermined period; and an adder for multiplying the outputs of each delay by each tap coefficient, and calculating the sum of the products.

11. The narrow-band noise remover of claim 10, wherein the adaptive filter updates the tap coefficients such that the difference before and after passing through the adaptive filter becomes minimal.

12. The narrow-band noise remover of claim 8, wherein the first delay employs an auto-correlation function $$R_{xx}(\tau)=E[x(t)x(t+\tau)]$$

wherein x(t) is the input signal and $\tau$ is the delay.

13. The narrow-band noise remover of claim 8, wherein the adaptive filter includes a plurality of delay elements, wherein each of said delay elements delays the signal by a predetermined period T and each delayed signal is multiplied by a tap coefficient $C_n$(n=0, . . . , n−1), wherein the weight $C_n$ is updated using the stochastic gradient algorithm as follows $$C_n(k+l)=C_n(k)-\mu e_k r(kT-nT)$$

wherein the terms are defined as follows:

$C_n(k)$: tap coefficient of the n$^{th}$ tap at the time kT;

$\mu$: step size for updating the tap coefficient;

r(t): output signal of the first delay;

$e_k$: z(kT)−r(kT); and z(kT): output of the adaptive filter at the time kT.

* * * * *